US012648132B2

(12) United States Patent
Ju et al.

(10) Patent No.: US 12,648,132 B2
(45) Date of Patent: Jun. 2, 2026

(54) SEMICONDUCTOR DEVICES HAVING CELL ARRAY AND PERIPHERAL REGIONS THEREIN

(71) Applicant: Samsung Electronics Co., Ltd., Suwon-si (KR)

(72) Inventors: Jungmin Ju, Uiwang-si (KR); Gyuhyun Kil, Hwaseong-si (KR); Hyebin Choi, Suwon-si (KR); Doosan Back, Seoul (KR); Ahrang Choi, Hwaseong-si (KR); Jung-Hoon Han, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 860 days.

(21) Appl. No.: 18/049,061

(22) Filed: Oct. 24, 2022

(65) Prior Publication Data

US 2023/0276619 A1      Aug. 31, 2023

(30) Foreign Application Priority Data

Jan. 28, 2022      (KR) ........................ 10-2022-0013050

(51) Int. Cl.
      *H10B 12/00*          (2023.01)
(52) U.S. Cl.
      CPC ............. *H10B 12/50* (2023.02); *H10B 12/09* (2023.02); *H10B 12/315* (2023.02)
(58) Field of Classification Search
      CPC ...... H10B 12/50; H10B 12/09; H10B 12/315; H10B 12/482; H10B 12/36; H10D 30/014; H10D 30/6735; H10D 30/751;
            H10D 62/121; H10D 84/0181; H10D 84/038; H10D 84/856; H10D 30/43; H10D 64/514; H10D 64/685; H10D 64/691; H10D 84/0144; H10D 84/83; H10D 62/235; H10D 64/516; B82Y 10/00; H10K 59/8792; H10K 59/122; H10K 71/233; H10K 59/126; H10K 59/875; H10K 50/865; H10K 50/844;
      (Continued)

(56) References Cited

U.S. PATENT DOCUMENTS 7,029,994 B2      4/2006   Ge et al.
8,168,489 B2      5/2012   Chen et al.
      (Continued)

FOREIGN PATENT DOCUMENTS

KR            100985935 B1      10/2010
KR      10-2018-0038604 A      4/2018
      (Continued)

*Primary Examiner* — Jonathan Han
(74) *Attorney, Agent, or Firm* — Wolf, Greenfield & Sacks, P.C.

(57)          ABSTRACT

A semiconductor device includes a substrate having first and second active patterns therein, which are spaced apart from each other. The first active pattern has a top surface that is elevated relative to a top surface of the second active pattern. A channel semiconductor layer is provided on the top surface of the first active pattern. A first gate pattern is provided, which includes a first insulating pattern, on the channel semiconductor layer. A second gate pattern is provided, which includes a second insulating pattern having a thickness greater than a thickness of the first insulating pattern, on the top surface of the second active pattern.

20 Claims, 17 Drawing Sheets

(58) Field of Classification Search
CPC ........ H10K 71/00; B60K 35/60; B60K 35/22;
B60K 35/00; B60K 35/425; H01L
25/075; H10H 20/01; H10H 20/855
See application file for complete search history.

(56) References Cited

U.S. PATENT DOCUMENTS

| | | | |
|---|---|---|---|
| 8,188,547 B2 | 5/2012 | Manabe et al. | |
| 8,482,077 B2 | 7/2013 | Lee et al. | |
| 8,871,595 B2 | 10/2014 | Ramkumar et al. | |
| 9,859,158 B2 | 1/2018 | Kang et al. | |
| 10,950,620 B2 | 3/2021 | Jung et al. | |
| 11,735,588 B2 | 8/2023 | Yoon et al. | |
| 2010/0167482 A1 | 7/2010 | Mori et al. | |
| 2019/0326278 A1* | 10/2019 | Lee ................... | H10D 84/0177 |
| 2019/0326318 A1* | 10/2019 | Jung ...................... | H10B 43/10 |

FOREIGN PATENT DOCUMENTS

| | | | |
|---|---|---|---|
| KR | 10-2019-0122345 A | 10/2019 | |
| KR | 10-2020-0115762 A | 10/2020 | |

* cited by examiner

SEMICONDUCTOR DEVICES HAVING CELL ARRAY AND PERIPHERAL REGIONS THEREIN

REFERENCE TO PRIORITY APPLICATION

This U.S. non-provisional patent application claims priority under 35 U.S.C. § 119 to Korean Patent Application No. 10-2022-0013050, filed Jan. 28, 2022, the entire contents of which are hereby incorporated herein by reference.

BACKGROUND

The present disclosure relates to semiconductor devices and methods of manufacturing the same.

Semiconductor devices are widely used in an electronic industry because of their small sizes, multi-functional characteristics, and/or low manufacturing costs. Semiconductor devices may be categorized as any one of semiconductor memory devices for storing logical data, semiconductor logic devices for processing logical data, and hybrid semiconductor devices having both the function of the semiconductor memory devices and the function of the semiconductor logic devices.

As high-speed and/or low-power electronic devices have been demanded, high-speed and/or low-voltage semiconductor devices used therein have also been demanded, and highly integrated semiconductor devices have been required to satisfy these demands. However, as the integration densities of semiconductor devices increase, electrical characteristics and production yields of the semiconductor devices may be reduced. Thus, techniques for improving electrical characteristics and production yields of semiconductor devices have been pursued.

SUMMARY

Embodiments of the inventive concepts may provide a semiconductor device with improved electrical characteristics and reliability, and methods of manufacturing the same.

According to some embodiments, a semiconductor device is provided that includes a substrate having a first active pattern and a second active pattern therein that are spaced apart from each other. A first gate pattern is provided on the first active pattern, and a channel semiconductor layer is provided between the first active pattern and the first gate pattern. A second gate pattern is provided on the second active pattern. The first gate pattern may include a first insulating pattern on the channel semiconductor layer, and the second gate pattern may include a second insulating pattern on the second active pattern. A thickness of the second insulating pattern may be greater than a thickness of the first insulating pattern, and a top surface of the first active pattern may be located at a higher level than a top surface of the second active pattern.

According to further embodiments, a semiconductor device is provided that includes a substrate having first to fourth active patterns therein, which are spaced apart from each other. First through fourth gate patterns are provided on the first to fourth active patterns, respectively. A channel semiconductor layer is provided, which extends between the third active pattern and the third gate pattern. The first gate pattern may include a first insulating pattern, a first high-k dielectric pattern and a first conductive pattern, which are sequentially stacked on the first active pattern. The second gate pattern may include a second insulating pattern, a second high-k dielectric pattern and a second conductive pattern, which are sequentially stacked on the second active pattern. The third gate pattern may include a third insulating pattern, a third high-k dielectric pattern and a third conductive pattern, which are sequentially stacked on the channel semiconductor layer. The fourth gate pattern may include a fourth insulating pattern, a fourth high-k dielectric pattern and a fourth conductive pattern, which are sequentially stacked on the fourth active pattern. A thickness of each of the second and fourth insulating patterns may be greater than a thickness of each of the first and third insulating patterns, and a top surface of the third active pattern may be located at a higher level than a top surface of each of the second and fourth active patterns.

According to another embodiment, a semiconductor device may include a substrate having cell active patterns on a cell array region, and a first peripheral active pattern and a second peripheral active pattern that are spaced apart from each other on a peripheral region in a vicinity of the cell array region. Word lines are provided on the substrate, which intersect the cell active patterns. Bit lines are provided on the substrate, which intersect the word lines. A bit line contact is provided, which extends on a central portion of each of the cell active patterns, and is connected to each of the bit lines. A storage node contact is provided on each of both end portions of each of the cell active patterns, and a landing pad is provided on the storage node contact. A data storage element is provided on the landing pad. A first peripheral gate pattern is provided on the first peripheral active pattern. A channel semiconductor layer is provided between the first peripheral active pattern and the first peripheral gate pattern, and a second peripheral gate pattern is provided on the second peripheral active pattern. The first peripheral gate pattern may include a first peripheral insulating pattern on the channel semiconductor layer, and the second peripheral gate pattern may include a second peripheral insulating pattern on the second peripheral active pattern. A thickness of the second peripheral insulating pattern may be greater than a thickness of the first peripheral insulating pattern, and a top surface of the first peripheral active pattern and top surfaces of the cell active patterns may be located at a higher level than a top surface of the second peripheral active pattern.

According to still further embodiments, a semiconductor device is provided, which includes a substrate having first and second active patterns therein, which are spaced apart from each other. The first active pattern has a top surface that is elevated relative to a top surface of the second active pattern. A channel semiconductor layer is provided on the top surface of the first active pattern, and a first gate pattern including a first insulating pattern, is provided on the channel semiconductor layer. A second gate pattern including a second insulating pattern (having a thickness greater than a thickness of the first insulating pattern), is provided on the top surface of the second active pattern. According to some of these embodiments, a first portion of the second insulating pattern extends at a lower level relative to the top surface of the first active pattern, and a second portion of the second insulating pattern extends at a higher level than the top surface of the first active pattern, as measured in a direction normal to the top surface of the second active pattern.

BRIEF DESCRIPTION OF THE DRAWINGS

FIG. 2 is a cross-sectional view taken along lines R1-R1', R2-R2', R3-R3', R4-R4' and R5-R5' of FIG. 1, which illustrate a semiconductor device according to some embodiments of the inventive concepts.

FIG. 12 is a cross-sectional view taken along the lines R1-R1', R2-R2', R3-R3', R4-R4' and R5-R5' of FIG. 1, which illustrate a semiconductor device according to some embodiments of the inventive concepts.

DETAILED DESCRIPTION

Example embodiments of the inventive concepts will now be described more fully with reference to the accompanying drawings.

Figure 1:
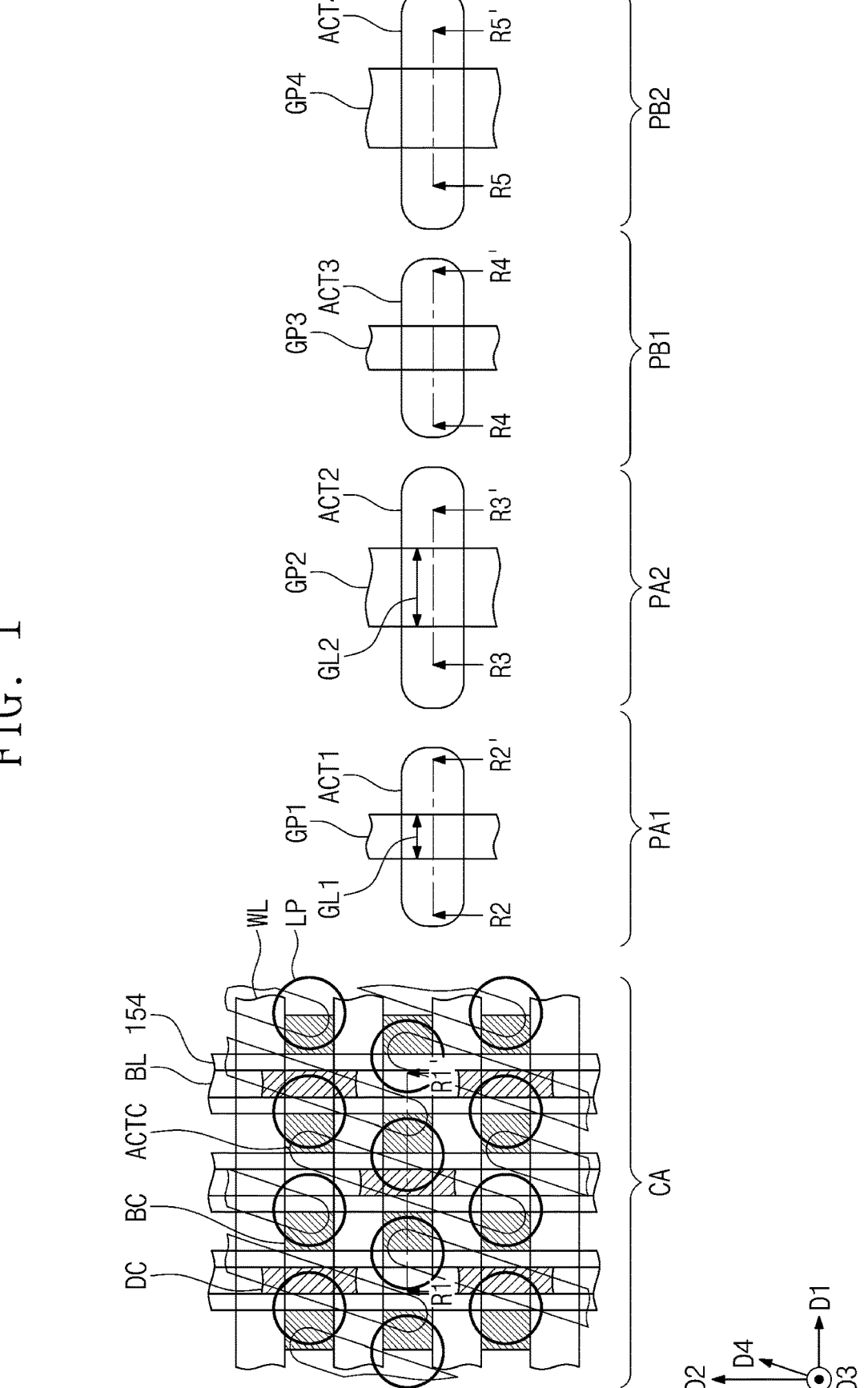
FIG. 1 is a plan view illustrating a semiconductor device according to some embodiments of the inventive concepts.
Figure 2:
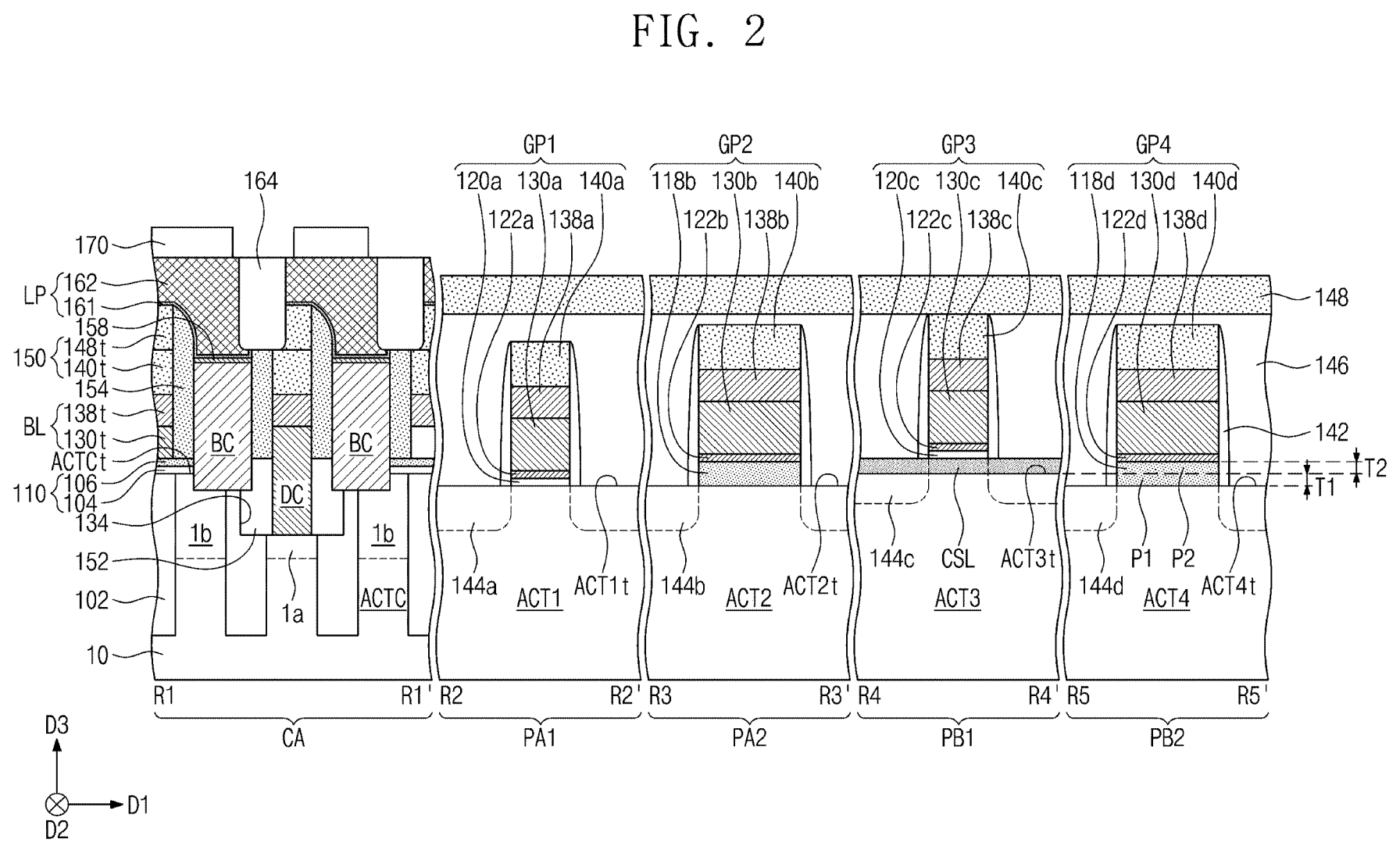

FIG. 1 is a plan view illustrating a semiconductor device according to some embodiments of the inventive concepts. FIG. 2 is a cross-sectional view taken along lines R1-R1', R2-R2', R3-R3', R4-R4' and R5-R5' of FIG. 1, which illustrates a semiconductor device according to some embodiments of the inventive concepts.

Referring to FIGS. 1 and 2, a substrate 10 including a "memory" cell array region CA, a first peripheral region PA1, a second peripheral region PA2, a third peripheral region PB1 and a fourth peripheral region PB2 may be provided. The substrate 10 may be a semiconductor substrate. For example, the substrate 10 may be a silicon (Si) substrate, a germanium (Ge) substrate, or a silicon-germanium (Si—Ge) substrate. In certain embodiments, the substrate 10 may be a silicon-on-insulator (SOI) substrate. A top surface of the substrate 10 may be parallel to a first direction D1 and a second direction D2 and may be perpendicular to a third direction D3. For example, the first to third directions D1, D2 and D3 may be directions that are orthogonal to each other.

The first to fourth peripheral regions PA1, PA2, PB1 and PB2 may be provided in the vicinity of the cell array region CA. The first to fourth peripheral regions PA1, PA2, PB1 and PB2 are arranged from the cell array region CA in the first direction D1 away from the cell array region CA in FIG. 1, but embodiments of the inventive concepts are not limited thereto. The first to fourth peripheral regions PA1, PA2, PB1 and PB2 may be regions on which peripheral circuit transistors for driving word lines WL and bit lines BL of the cell array region CA are provided. For example, an NMOS low-voltage transistor may be provided on the first peripheral region PA1, and an NMOS high-voltage transistor may be provided on the second peripheral region PA2. For example, a PMOS low-voltage transistor may be provided on the third peripheral region PB1, and a PMOS high-voltage transistor may be provided on the fourth peripheral region PB2.

The cell array region CA may be a region on which word lines WL, bit lines BL and cell transistors connected thereto are provided. A structure on the cell array region CA may be a cell array of a dynamic random access memory (DRAM) device, but embodiments of the inventive concepts are not limited thereto.

Cell active patterns ACTC may be provided on the cell array region CA of the substrate 10. Each of the cell active patterns ACTC may have an isolated shape. The cell active patterns ACTC may be spaced apart from each other in the first direction D1 and the second direction D2. Each of the cell active patterns ACTC may have a bar shape extending in a fourth direction D4 which is parallel to the top surface of the substrate 10 and intersects the first direction D1 and the second direction D2. An end portion of one of the cell active patterns ACTC may be disposed adjacent to a central portion of another cell active pattern ACTC adjacent to the one cell active pattern ACTC.

A cell device isolation layer 102 may be provided between the cell active patterns ACTC. The cell device isolation layer 102 may be provided in the substrate 10 to define the cell active patterns ACTC. For example, the cell device isolation layer 102 may include at least one of silicon oxide, silicon nitride, or silicon oxynitride.

The word lines WL may be provided in the substrate 10 to intersect the cell active patterns ACTC and the cell device isolation layer 102. The word lines WL may be provided in grooves formed in the cell active patterns ACTC and the cell device isolation layer 102. In other words, the word lines WL may be buried in the substrate 10. The word lines WL may extend in the first direction D1 and may be spaced apart from each other in the second direction D2.

First and second dopant regions $1a$ and $1b$ may be provided in the cell active patterns ACTC. The first dopant region $1a$ may be provided in a central portion of each of the cell active patterns ACTC between a pair of the word lines WL, and the second dopant regions $1b$ may be provided in both end portions of each of the cell active patterns ACTC, respectively. The first dopant region $1a$ may be located between the second dopant regions $1b$. The first dopant region $1a$ may have the same conductivity type (e.g., an n-type) as the second dopant regions $1b$. For example, the first dopant region $1a$ may correspond to a common drain region of the cell transistor, and each of the second dopant regions $1b$ may correspond to a source region of the cell transistor.

A buffer layer 110 may be provided on the substrate 10. The buffer layer 110 may include a first buffer insulating layer 104 and a second buffer insulating layer 106, which are sequentially stacked. The second buffer insulating layer 106 may include a material having an etch selectivity with respect to the first buffer insulating layer 104. For example, the first buffer insulating layer 104 may include silicon oxide, and the second buffer insulating layer 106 may include silicon nitride.

The bit lines BL may be provided on the buffer layer 110. The bit lines BL may intersect the word lines WL. The bit lines BL may extend in the second direction D2 and may be spaced apart from each other in the first direction D1. Each of the bit lines BL may include a lower bit line conductive pattern $130t$ and an upper bit line conductive pattern $138t$, which are sequentially stacked. For example, the lower bit line conductive pattern $130t$ may include poly-silicon doped with dopants. For example, the upper bit line conductive pattern $138t$ may include a metal such as aluminum, tungsten, or copper. In some embodiments, each of the bit lines BL may further include a bit line barrier pattern between the lower bit line conductive pattern $130t$ and the upper bit line conductive pattern $138t$. For example, the bit line barrier pattern may include a metal nitride such as titanium nitride, tungsten nitride, or tantalum nitride.

A bit line capping pattern 150 may be provided on the upper bit line conductive pattern 138*t* of each of the bit lines BL. The bit line capping pattern 150 may include a first capping pattern 140*t* and a second capping pattern 148*t*, which are sequentially stacked. For example, the first and second capping patterns 140*t* and 148*t* may include silicon nitride.

Bit line spacers 154 may be provided to cover both side surfaces of each of the bit lines BL and both side surfaces of the bit line capping pattern 150. The bit line spacers 154 may extend in the second direction D2 along the both side surfaces of each of the bit lines BL. For example, the bit line spacers 154 may include at least one of silicon oxide, silicon nitride, or silicon oxynitride. In some embodiments, each of the bit line spacers 154 may have a multi-layered structure including two or more of silicon oxide, silicon nitride, or silicon oxynitride. In certain embodiments, each of the bit line spacers 154 may include an air gap therein. A width of the bit line spacer 154 in the first direction D1 may decrease as a level in the third direction D3 increases. An outer side surface (i.e., a side surface opposite to the bit line BL) of each of the bit line spacers 154 may be aligned with a side surface of the buffer layer 110. In other words, the buffer layer 110 may be disposed between each of the bit lines BL and the cell device isolation layer 102 and between each of the bit line spacers 154 and each of the cell active patterns ACTC. Each of the bit lines BL may be electrically connected to the first dopant region 1*a* through a bit line contact DC. For example, the bit line contact DC may include poly-silicon doped with dopants.

An upper portion of the first dopant region 1*a* and an upper portion of the cell device isolation layer 102 adjacent thereto may define a recess region 134. A bottom surface of the recess region 134 may be located at a lower level than a top surface ACTCt of each of the cell active patterns ACTC. The bit line contact DC may be provided in the recess region 134.

A filling insulation pattern 152 may be provided to fill a space between a lower side surface of the bit line contact DC and an inner side surface of the recess region 134. For example, the filling insulation pattern 152 may include at least one of silicon oxide, silicon nitride, or silicon oxynitride. In some embodiments, the filling insulation pattern 152 may have a multi-layered structure including two or more of silicon oxide, silicon nitride, or silicon oxynitride.

A storage node contact BC may be provided between a pair of the bit lines BL adjacent to each other in the first direction D1. The storage node contact BC may penetrate the buffer layer 110 and may be in contact with each of the second dopant regions 1*b*. For example, the storage node contact BC may include poly-silicon doped with dopants. The storage node contact BC may be provided in plurality, and the storage node contacts BC may be spaced apart from each other in the first direction D1 and the second direction D2. The storage node contacts BC may have island shapes spaced apart from each other when viewed in the plan view of FIG. 1. A storage node ohmic layer 158 may be provided on the storage node contact BC. For example, the storage node ohmic layer 158 may include a metal silicide (e.g., cobalt silicide).

A landing pad LP may be provided on the bit line capping pattern 150, the bit line spacers 154 and the storage node ohmic layer 158. The landing pad LP may include a landing pad barrier pattern 161 conformally covering top surfaces of the bit line capping pattern 150, the bit line spacers 154 and the storage node ohmic layer 158, and a landing pad conductive pattern 162 on the landing pad barrier pattern 161. For example, the landing pad barrier pattern 161 may include a metal nitride such as titanium nitride, tungsten nitride, or tantalum nitride. For example, the landing pad conductive pattern 162 may include a metal such as aluminum, tungsten, or copper.

An upper portion of the landing pad LP may have a width greater than that of the storage node contact BC. A center of the landing pad LP may be shifted from a center of the storage node contact BC in the first direction D1. The landing pad LP may overlap with a portion of each of the bit lines BL in the third direction D3.

The landing pad LP may be provided in plurality, and the landing pads LP may be separated from each other by a landing pad separation pattern 164. In other words, the landing pad separation pattern 164 may define the landing pads LP. The landing pad separation pattern 164 may penetrate a portion of each of the bit line spacers 154. A top surface of the landing pad separation pattern 164 may be substantially coplanar with top surfaces of the landing pads LP. For example, the landing pad separation pattern 164 may include at least one of silicon oxide, silicon nitride, or silicon oxynitride. In some embodiments, the landing pad separation pattern 164 may have a multi-layered structure including two or more of silicon oxide, silicon nitride, or silicon oxynitride.

The plurality of landing pads LP may be spaced apart from each other in the first direction D1 and the second direction D2. The landing pads LP may have island shapes spaced apart from each other when viewed in the plan view of FIG. 1. In some embodiments, six landing pads LP adjacent to one of the landing pads LP may be arranged in a hexagonal form. In other words, the landing pads LP may be arranged in a honeycomb form.

A data storage element 170 may be provided on the landing pad LP. For some examples, the data storage element 170 may include a capacitor including a lower electrode, a dielectric layer and an upper electrode. In this case, the semiconductor device according to the inventive concepts may be a dynamic random access memory (DRAM) device. For other examples, the data storage element 170 may include a magnetic tunnel junction pattern. In this case, the semiconductor device according to the inventive concepts may be a magnetic random access memory (MRAM) device. For still other examples, the data storage element 170 may include a phase-change material or a variable resistance material. In this case, the semiconductor device according to the inventive concepts may be a phase-change random access memory (PRAM) device or a resistive random access memory (ReRAM) device. However, embodiments of the inventive concepts are not limited thereto, and the data storage element 170 may include at least one of other various structures and/or materials capable of storing data.

A first peripheral active pattern ACT1 defined by a peripheral device isolation layer may be provided on the first peripheral region PA1 of the substrate 10. A first peripheral gate pattern GP1 may be provided on the first peripheral active pattern ACT1. The first peripheral gate pattern GP1 may include a first peripheral insulating pattern 120*a*, a first peripheral high-k dielectric pattern 122*a*, a first peripheral lower conductive pattern 130*a*, a first peripheral upper conductive pattern 138*a* and a first peripheral capping pattern 140*a*, which are sequentially stacked on the first peripheral active pattern ACT1. In some additional embodiments, the first peripheral gate pattern GP1 may further include an n-type metal containing pattern and a p-type metal containing pattern (not shown), which are provided between the first peripheral high-k dielectric pattern 122*a* and the first peripheral lower conductive pattern 130*a*.

A second peripheral active pattern ACT2 defined by the peripheral device isolation layer may be provided on the second peripheral region PA2 of the substrate 10. The second peripheral active pattern ACT2 may be spaced apart from the first peripheral active pattern ACT1. A second peripheral gate pattern GP2 may be provided on the second peripheral active pattern ACT2. The second peripheral gate pattern GP2 may include a second peripheral insulating pattern 118*b*, a second peripheral high-k dielectric pattern 122*b*, a second peripheral lower conductive pattern 130*b*, a second peripheral upper conductive pattern 138*b* and a second peripheral capping pattern 140*b*, which are sequentially stacked on the second peripheral active pattern ACT2. In some additional embodiments, the second peripheral gate pattern GP2 may further include an n-type metal containing pattern and a p-type metal containing pattern (not shown), which are provided between the second peripheral high-k dielectric pattern 122*b* and the second peripheral lower conductive pattern 130*b*.

As shown by FIG. 1, a first gate length GL1 defined as a width of the first peripheral gate pattern GP1 in the first direction D1 (i.e., a distance between both side surfaces of the first peripheral gate pattern GP1) may be less than a second gate length GL2 defined as a width of the second peripheral gate pattern GP2 in the first direction D1 (i.e., a distance between both side surfaces of the second peripheral gate pattern GP2). A thickness, in the third direction D3, of the first peripheral insulating pattern 120*a* of the first peripheral gate pattern GP1 may be less than a thickness, in the third direction D3, of the second peripheral insulating pattern 118*b* of the second peripheral gate pattern GP2. Hereinafter, the term 'thickness' may mean a thickness in the third direction D3. The thickness of the second peripheral insulating pattern 118*b* may range from about 2 times to about 10 times the thickness of the first peripheral insulating pattern 120*a*.

First source/drain regions 144*a* may be provided in the first peripheral active pattern ACT1 at both sides of the first peripheral gate pattern GP1, respectively. Second source/drain regions 144*b* may be provided in the second peripheral active pattern ACT2 at both sides of the second peripheral gate pattern GP2, respectively. For example, the first and second source/drain regions 144*a* and 144*b* may be dopant regions having a first conductivity type (e.g., an n-type). Furthermore, in some additional embodiments, a dopant concentration of the first source/drain region 144*a* may be different from a dopant concentration of the second source/drain region 144*b*.

A third peripheral active pattern ACT3 defined by the peripheral device isolation layer may be provided on the third peripheral region PB1 of the substrate 10. The third peripheral active pattern ACT3 may be spaced apart from the first and second peripheral active patterns ACT1 and ACT2. A channel semiconductor layer CSL may be provided on the third peripheral active pattern ACT3. In some embodiments, a lattice constant of the channel semiconductor layer CSL may be greater than a lattice constant of the substrate 10. For example, the channel semiconductor layer CSL may include silicon-germanium.

A third peripheral gate pattern GP3 may be provided on the channel semiconductor layer CSL. The third peripheral gate pattern GP3 may include a third peripheral insulating pattern 120*c*, a third peripheral high-k dielectric pattern

122*c*, a third peripheral lower conductive pattern 130*c*, a third peripheral upper conductive pattern 138*c* and a third peripheral capping pattern 140*c*, which are sequentially stacked on the channel semiconductor layer CSL, as shown. In some embodiments, the third peripheral gate pattern GP3 may further include a p-type metal containing pattern (not shown) between the third peripheral high-k dielectric pattern 122*c* and the third peripheral lower conductive pattern 130*c*.

A fourth peripheral active pattern ACT4 defined by the peripheral device isolation layer may be provided on the fourth peripheral region PB2 of the substrate 10. The fourth peripheral active pattern ACT4 may be spaced apart from the first to third peripheral active patterns ACT1, ACT2 and ACT3. A fourth peripheral gate pattern GP4 may be provided on the fourth peripheral active pattern ACT4. The fourth peripheral gate pattern GP4 may include a fourth peripheral insulating pattern 118*d*, a fourth peripheral high-k dielectric pattern 122*d*, a fourth peripheral lower conductive pattern 130*d*, a fourth peripheral upper conductive pattern 138*d* and a fourth peripheral capping pattern 140*d*, which are sequentially stacked on the fourth peripheral active pattern ACT4. In some additional embodiments, the fourth peripheral gate pattern GP4 may further include a p-type metal containing pattern (not shown) between the fourth peripheral high-k dielectric pattern 122*d* and the fourth peripheral lower conductive pattern 130*d*.

A width of the third peripheral gate pattern GP3 in the first direction D1 may be less than a width of the fourth peripheral gate pattern GP4 in the first direction D1. A thickness of the third peripheral insulating pattern 120*c* of the third peripheral gate pattern GP3 may be less than a thickness of the fourth peripheral insulating pattern 118*d* of the fourth peripheral gate pattern GP4. The thickness of the third peripheral insulating pattern 120*c* may be substantially equal to the thickness of the first peripheral insulating pattern 120*a* of the first peripheral gate pattern GP1. And, the thickness of the fourth peripheral insulating pattern 118*d* may be substantially equal to the thickness of the second peripheral insulating pattern 118*b* of the second peripheral gate pattern GP2. The thickness of the fourth peripheral insulating pattern 118*d* may range from about 2 times to 10 times the thickness of the third peripheral insulating pattern 120*c*.

Third source/drain regions 144*c* may be provided in the channel semiconductor layer CSL and the third peripheral active pattern ACT3 at both sides of the third peripheral gate pattern GP3, respectively. Fourth source/drain regions 144*d* may be provided in the fourth peripheral active pattern ACT4 at both sides of the fourth peripheral gate pattern GP4, respectively. For example, the third and fourth source/drain regions 144*c* and 144*d* may be dopant regions having a second conductivity type (e.g., a p-type) different from the first conductivity type of the first and second source/drain regions 144*a* and 144*b*. In some other embodiments, a dopant concentration of the third source/drain region 144*c* may be different from a dopant concentration of the fourth source/drain region 144*d*.

The first to fourth peripheral high-k dielectric patterns 122*a*, 122*b*, 122*c* and 122*d* may include a material having a dielectric constant higher than that of silicon oxide. For example, the first to fourth peripheral high-k dielectric patterns 122*a*, 122*b*, 122*c* and 122*d* may include at least one metal oxide of hafnium oxide (HfO), hafnium silicate (Hf-SiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO).

For example, the first to fourth peripheral lower conductive patterns 130a, 130b, 130c and 130d may include poly-silicon doped with dopants. The first and second peripheral lower conductive patterns 130a and 130b may have the first conductivity type (e.g., an n-type), and the third and fourth peripheral lower conductive patterns 130c and 130d may have the second conductivity type (e.g., a p-type). The first to fourth peripheral lower conductive patterns 130a, 130b, 130c and 130d may be formed simultaneously with the lower bit line conductive pattern 130t on the cell array region CA and may have substantially the same thickness as the lower bit line conductive pattern 130t.

For example, the first to fourth peripheral upper conductive patterns 138a, 138b, 138c and 138d may include a metal such as aluminum, tungsten, or copper. The first to fourth peripheral upper conductive patterns 138a, 138b, 138c and 138d may be formed simultaneously with the upper bit line conductive pattern 138t on the cell array region CA and may have substantially the same thickness as the upper bit line conductive pattern 138t.

For example, the first to fourth peripheral capping patterns 140a, 140b, 140c and 140d may include silicon nitride. The first to fourth peripheral capping patterns 140a, 140b, 140c and 140d may be formed simultaneously with the first capping pattern 140t of the bit line capping pattern 150 on the cell array region CA and may have substantially the same thickness as the first capping pattern 140t.

Peripheral/sidewall spacers 142 may be provided to cover side surfaces of the first to fourth peripheral gate patterns GP1, GP2, GP3 and GP4. A peripheral interlayer insulating layer 146 may be provided to cover the peripheral spacers 142 and the first to fourth peripheral gate patterns GP1, GP2, GP3 and GP4. On the third peripheral region PB1, the peripheral interlayer insulating layer 146 may cover a top surface of the channel semiconductor layer CSL. For example, a top surface of the peripheral interlayer insulating layer 146 may be substantially coplanar with a top surface of the third peripheral gate pattern GP3 (i.e., a top surface of the third peripheral capping pattern 140c).

A second capping layer 148 may be provided on the peripheral interlayer insulating layer 146. The second capping layer 148 may include a material different from that of the peripheral interlayer insulating layer 146. For example, the peripheral interlayer insulating layer 146 may include silicon oxide, and the second capping layer 148 may include silicon nitride. Advantageously, the second capping layer 148 may be formed simultaneously with the second capping pattern 148t of the bit line capping pattern 150 on the cell array region CA and may have substantially the same thickness as the second capping pattern 148t.

Top surfaces ACT1t, ACT2t and ACT4t of the first, second and fourth peripheral active patterns ACT1, ACT2 and ACT4 of the first, second and fourth peripheral regions PA1, PA2 and PB2 may be located at a lower level than the top surfaces ACTCt of the cell active patterns ACTC of the cell array region CA and a top surface ACT3t of the third peripheral active pattern ACT3 of the third peripheral region PB1 (i.e., a bottom surface of the channel semiconductor layer CSL). In other words, the top surface of the substrate 10 may have step height differences at a boundary between the cell array region CA and the first peripheral region PA1, a boundary between the second peripheral region PA2 and the third peripheral region PB1 and a boundary between the third peripheral region PB1 and the fourth peripheral region PB2. The top surface ACT1t of the first peripheral active pattern ACT1 may be located at substantially the same level as the top surfaces ACT2t and ACT4t of the second and fourth peripheral active patterns ACT2 and ACT4. The top surface ACT3t of the third peripheral active pattern ACT3 may be located at substantially the same level as the top surfaces ACTCt of the cell active patterns ACTC.

Each of the second peripheral insulating pattern 118b and the fourth peripheral insulating pattern 118d may include a first portion P1 located at a lower level than the top surface ACT3t of the third peripheral active pattern ACT3, and a second portion P2 located at a higher level than the top surface ACT3t of the third peripheral active pattern ACT3. The first portion P1 may overlap with the third peripheral active pattern ACT3 in a horizontal direction (i.e., the first direction D1 or the second direction D2), and the second portion P2 may overlap with at least a portion of the channel semiconductor layer CSL in the horizontal direction. For example, a first thickness T1 of the first portion P1 may range from about 0.5 times to about 2 times a second thickness T2 of the second portion P2. For example, a ratio of the first thickness T1 to a total thickness of each of the second peripheral insulating pattern 118b and the fourth peripheral insulating pattern 118d may range from about 30% to about 70%.

FIGS. 3 to 11 are cross-sectional views taken along the lines R1-R1', R2-R2', R3-R3', R4-R4' and R5-R5' of FIG. 1, and illustrate a method of manufacturing a semiconductor device according to some embodiments of the inventive concepts. Hereinafter, a method of manufacturing the semiconductor device illustrated by FIGS. 1 and 2 will be described in detail with reference to FIGS. 3 to 11.

Figure 3:
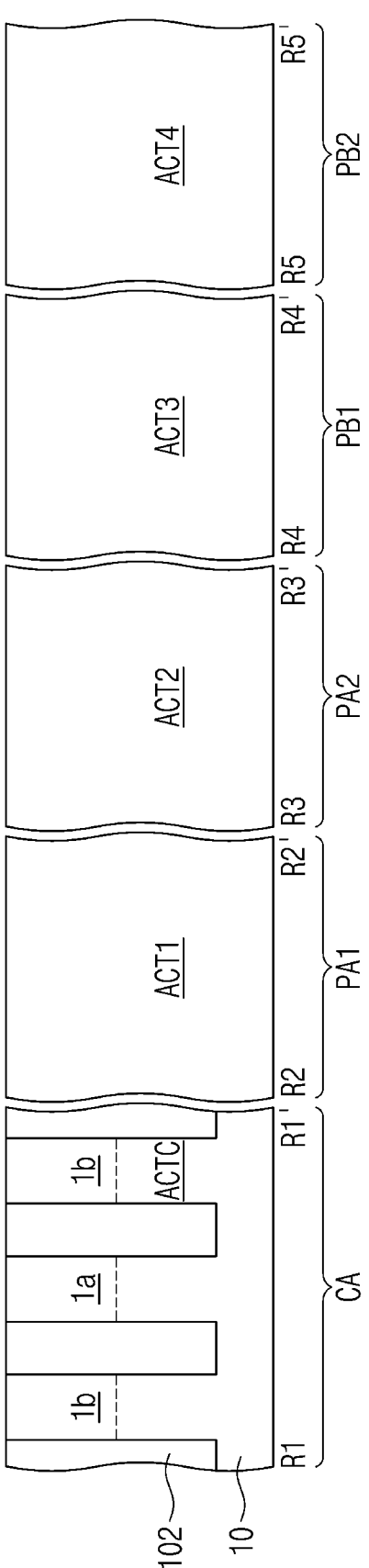
FIGS. 3 to 11 are cross-sectional views taken along the lines R1-R1', R2-R2', R3-R3', R4-R4' and R5-R5' of FIG. 1, which illustrate a method of manufacturing a semiconductor device according to some embodiments of the inventive concepts.

Referring to FIGS. 1 and 3, a cell device isolation layer 102 and a peripheral device isolation layer may be formed in a substrate 10 including a cell array region CA, a first peripheral region PA1, a second peripheral region PA2, a third peripheral region PB1 and a fourth peripheral region PB2. Cell active patterns ACTC may be defined by the cell device isolation layer 102, and first to fourth peripheral active patterns ACT1, ACT2, ACT3 and ACT4 may be defined by the peripheral device isolation layer. Word lines WL may be formed to be buried in the substrate 10 of the cell array region CA. First and second dopant regions 1a and 1b may be formed in the cell active patterns ACTC using an ion implantation process. The first to fourth peripheral active patterns ACT1, ACT2, ACT3 and ACT4 of the first to fourth peripheral regions PA1, PA2, PB1 and PB2 may be covered by a mask during the ion implantation process.

Figure 4:
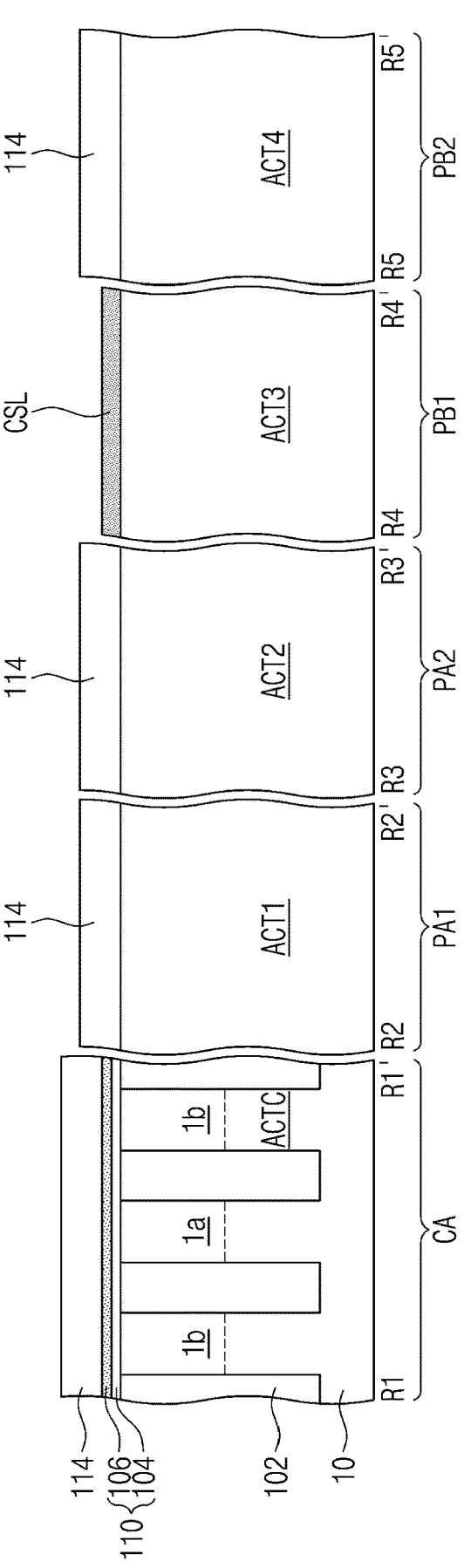

Referring to FIG. 4, a buffer layer 110 including a first buffer insulating layer 104 and a second buffer insulating layer 106 may be formed on the cell array region CA. The formation of the buffer layer 110 may include sequentially depositing insulating materials different from each other on an entire surface of the substrate 10, and patterning the insulating materials to expose the first to fourth peripheral active patterns ACT1, ACT2, ACT3 and ACT4.

A first sacrificial insulating layer 114 may be formed on the buffer layer 110 and the first, second and fourth peripheral active patterns ACT1, ACT2 and ACT4. For example, the first sacrificial insulating layer 114 may be formed of tetraethyl orthosilicate (TEOS). The formation of the first sacrificial insulating layer 114 may include depositing an insulating material on an entire surface of the substrate 10, and patterning the insulating material to expose the third peripheral active pattern ACT3.

A channel semiconductor layer CSL may be formed on the third peripheral active pattern ACT3. The channel semiconductor layer CSL may be formed by a selective epitaxial growth (SEG) process using a top surface of the third peripheral active pattern ACT3 as a seed. For example, the channel semiconductor layer CSL may be formed of silicon-germanium.

Figure 5:
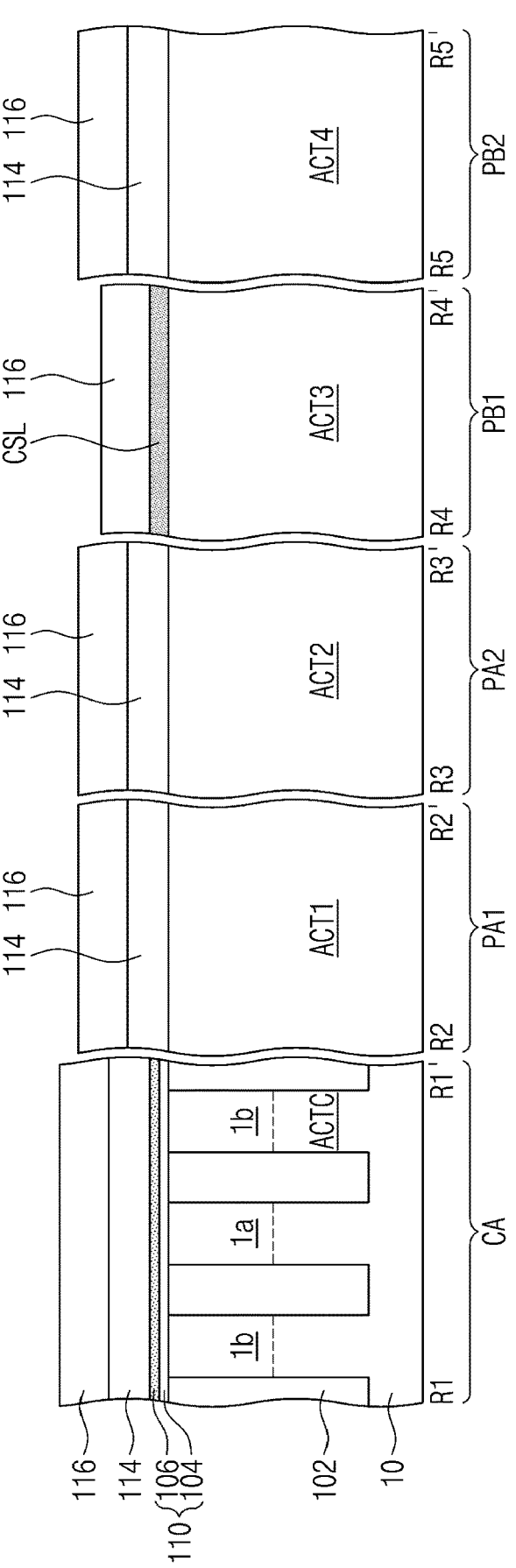

Referring to FIG. 5, a second sacrificial insulating layer 116 may be formed on an entire surface of the substrate 10. For example, the second sacrificial insulating layer 116 may be formed of silicon oxide, using an atomic layer deposition (ALD) process, for example.

Figure 6:
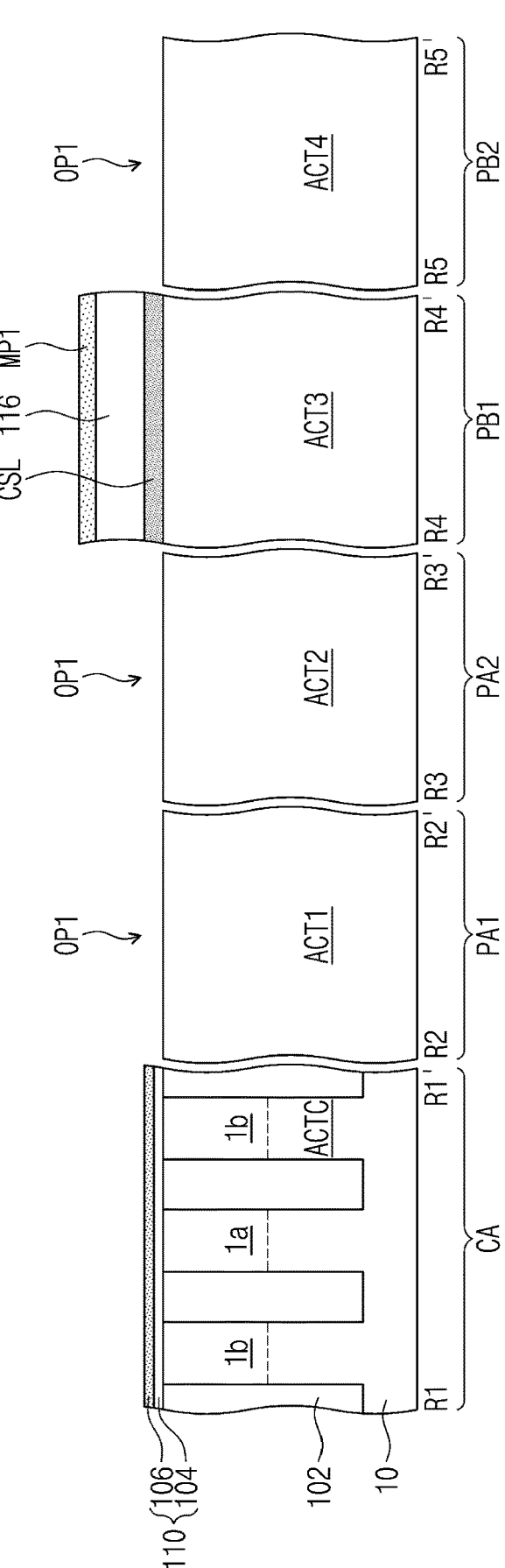

Referring to FIGS. 5 and 6, a first mask pattern MP1 covering the third peripheral region PB1 may be formed. The first mask pattern MP1 may be selectively formed on the second sacrificial insulating layer 116 of the third peripheral region PB1. The first mask pattern MP1 may have a first opening OP1 exposing the cell array region CA and the first, second and fourth peripheral regions PA1, PA2 and PB2. The first and second sacrificial insulating layers 114 and 116 on the cell array region CA and the first, second and fourth peripheral regions PA1, PA2 and PB2 exposed by the first opening OP1 may be removed, and a portion of the second sacrificial insulating layer 116 between the channel semiconductor layer CSL and the first mask pattern MP1 may remain.

Figure 7:
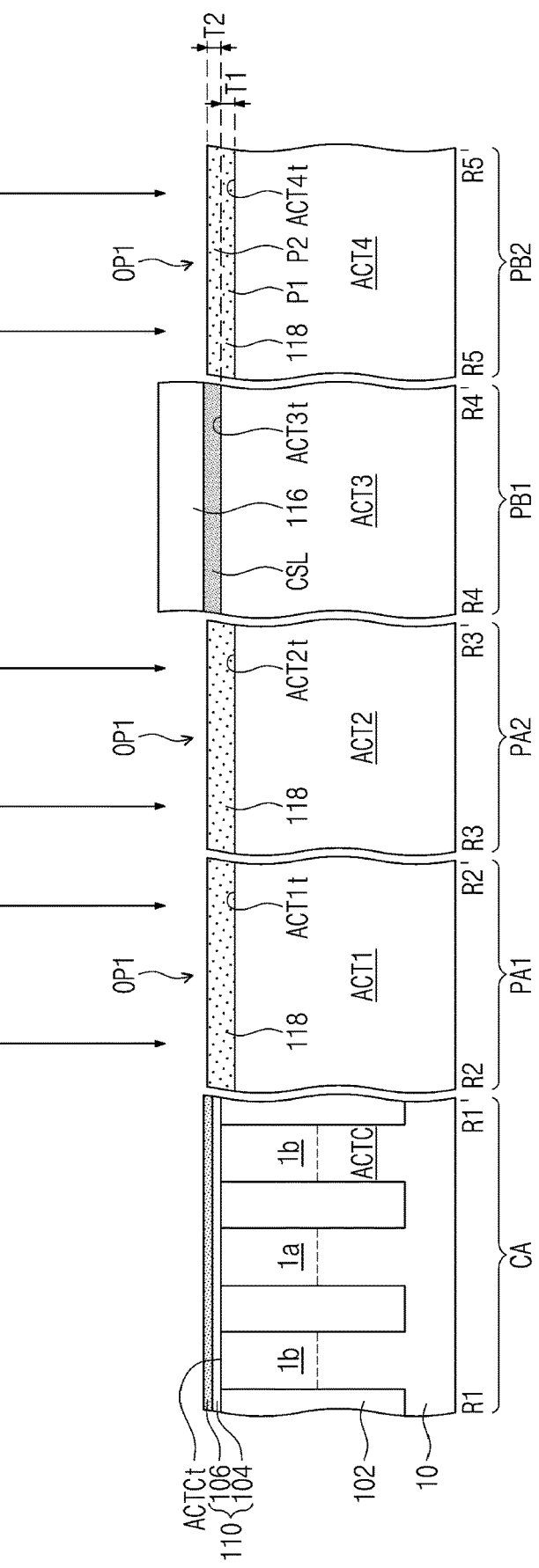

Referring to FIG. 7, a high-voltage peripheral insulating layer 118 may be formed on the first, second and fourth peripheral active patterns ACT1, ACT2 and ACT4 by a thermal oxidation process. At this time, the buffer layer 110 on the cell array region CA may be covered by an additional mask.

The high-voltage peripheral insulating layer 118 may include a first portion P1 corresponding to an oxidized portion of each of the first, second and fourth peripheral active patterns ACT1, ACT2 and ACT4, and a second portion P2 formed on the first portion P1. The first portion P1 of the high-voltage peripheral insulating layer 118 may be located at a lower level than a top surface ACT3*t* of the third peripheral active pattern ACT3, and the second portion P2 of the high-voltage peripheral insulating layer 118 may be located at a higher level than the top surface ACT3*t* of the third peripheral active pattern ACT3. The high-voltage peripheral insulating layer 118 may be formed of silicon oxide.

Figure 8:
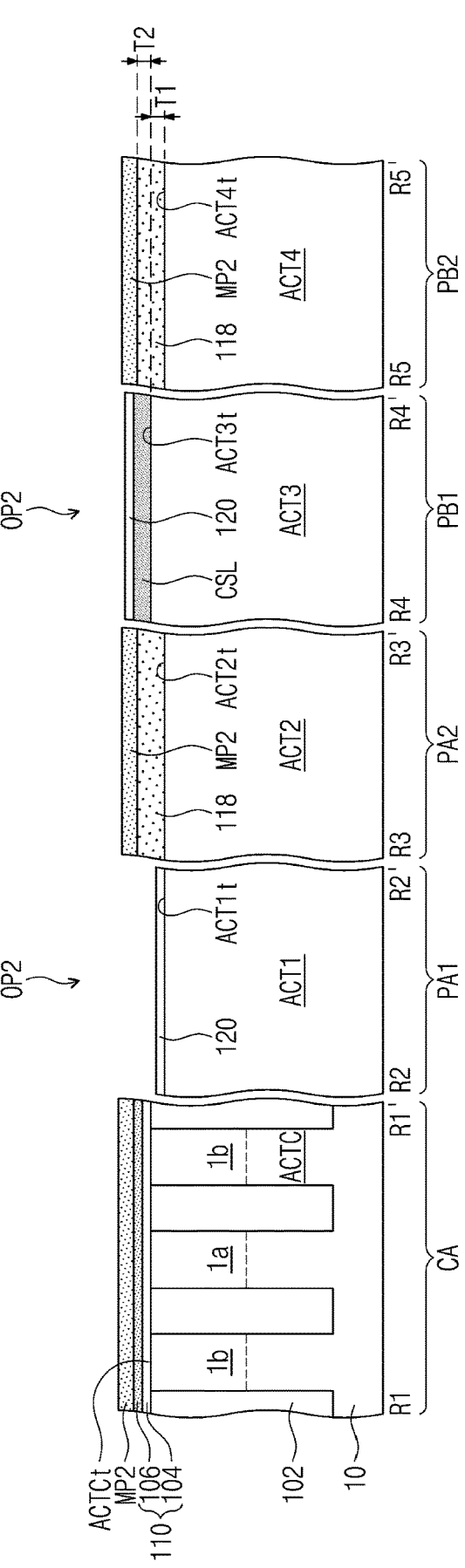

Referring to FIGS. 7 and 8, a second mask pattern MP2 may be formed to cover the cell array region CA and the second and fourth peripheral regions PA2 and PB2. The second mask pattern MP2 may have a second opening OP2 exposing the first and third peripheral regions PA1 and PB1. The high-voltage peripheral insulating layer 118 on the first peripheral region PA1 exposed by the second opening OP2 and the second sacrificial insulating layer 116 on the third peripheral region PB1 exposed by the second opening OP2 may be removed, and portions of the high-voltage peripheral insulating layer 118 on the second and fourth peripheral regions PA2 and PB2 may remain. A low-voltage peripheral insulating layer 120 may be formed on the first and third peripheral regions PA1 and PB1 exposed by the second opening OP2. The low-voltage peripheral insulating layer 120 may be formed with a thickness smaller than that of the high-voltage peripheral insulating layer 118. The low-voltage peripheral insulating layer 120 may be formed of silicon oxide. Thereafter, the second mask pattern MP2 may be removed.

Figure 9:
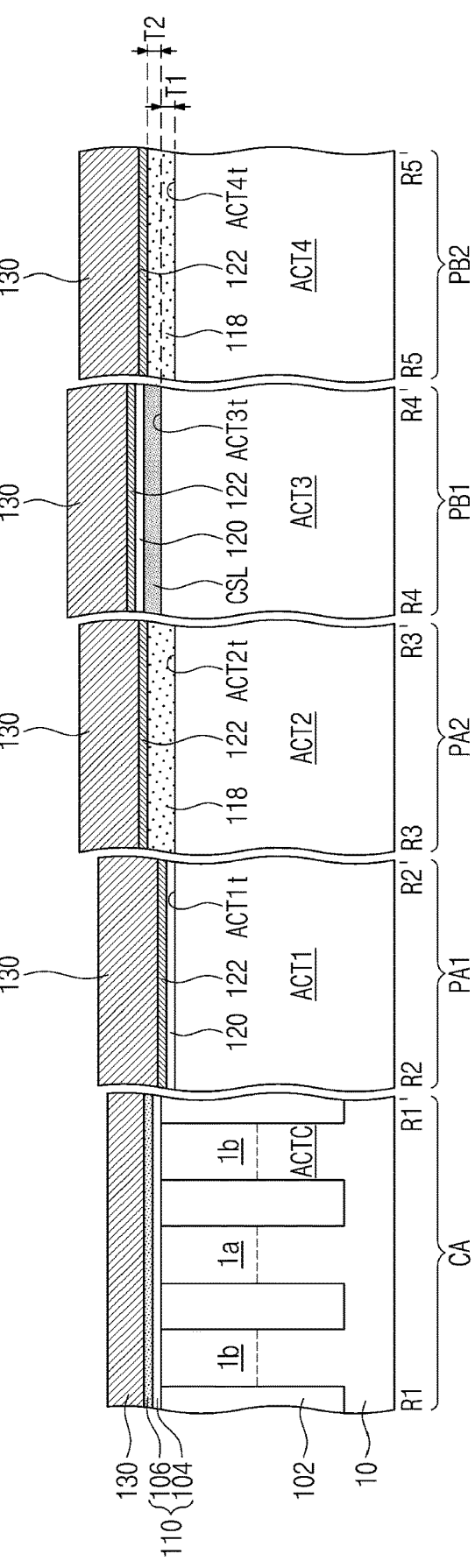

Referring to FIG. 9, a high-k dielectric layer 122 may be formed on the first to fourth peripheral regions PA1, PA2, PB1 and PB2. At this time, the buffer layer 110 on the cell array region CA may be covered by an additional mask. Thereafter, a first conductive layer 130 may be formed on an entire surface of the substrate 10. For example, the first conductive layer 130 may be formed of polysilicon.

Figure 10:
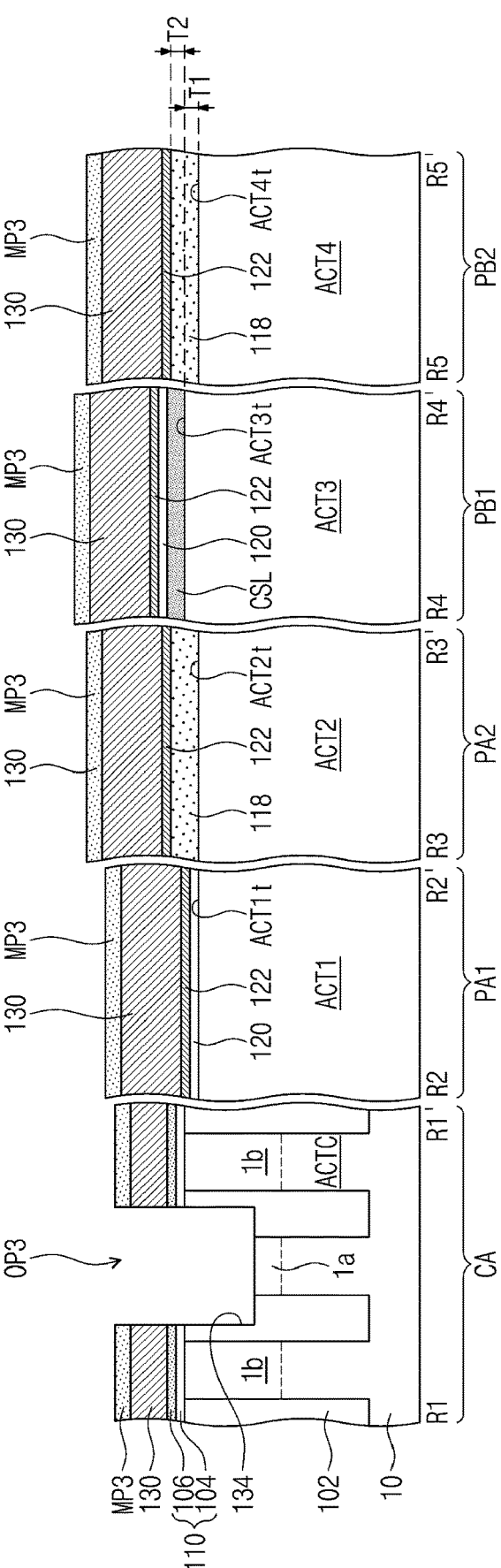

Referring to FIG. 10, a third mask pattern MP3 may be formed on an entire surface of the substrate 10. The third mask pattern MP3 may have a third opening OP3 exposing a portion of the cell array region CA. A portion of the substrate 10 and a portion of the cell device isolation layer 102, which are exposed by the third opening OP3, may be removed to expose the first dopant region 1*a* of each of the cell active patterns ACTC. A recess region 134 may be defined by the removal of the portion of the substrate 10 and the portion of the cell device isolation layer 102. Thereafter, the third mask pattern MP3 may be removed.

Figure 11:
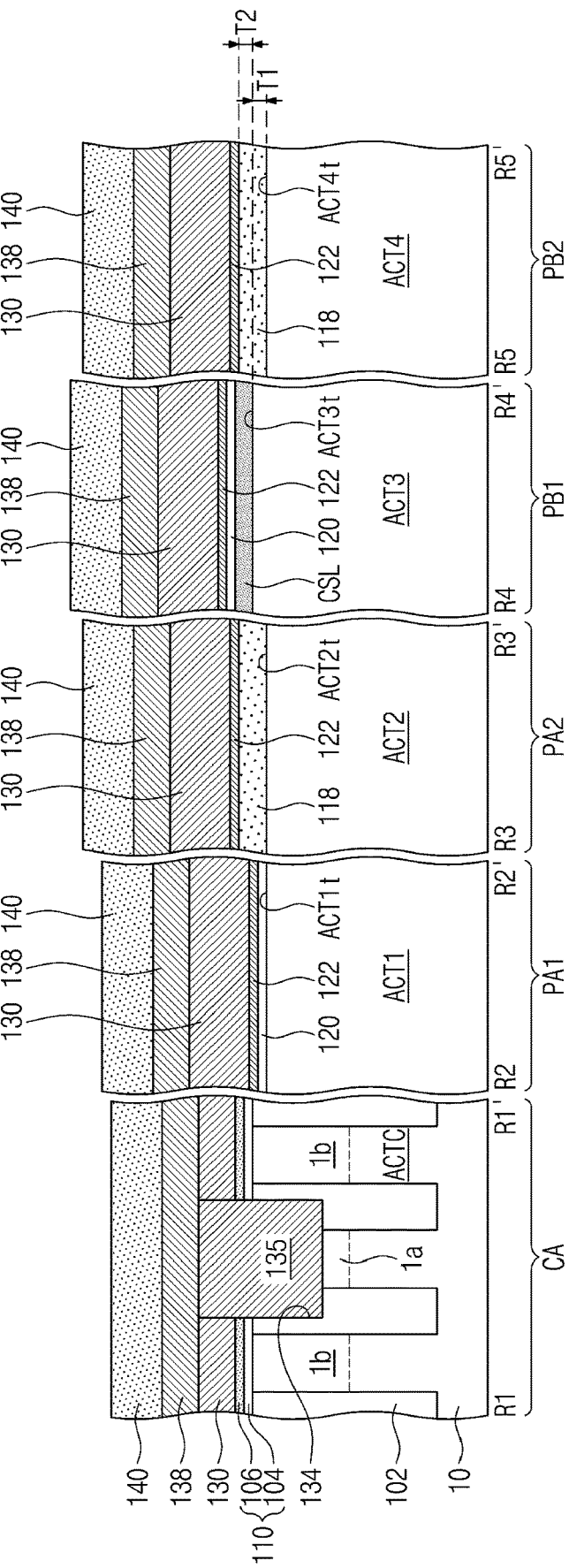

Referring to FIG. 11, a polysilicon pattern 135 may be formed in the recess region 134. A top surface of the polysilicon pattern 135 may be substantially coplanar with a top surface of the first conductive layer 130.

A second conductive layer 138 may be formed on the first conductive layer 130 and the polysilicon pattern 135. For example, the second conductive layer 138 may be formed of a metal such as aluminum, tungsten, or copper. A first capping layer 140 may be formed on the second conductive layer 138. For example, the first capping layer 140 may be formed of silicon nitride.

Referring again to FIGS. 1, 2 and 11, bit line contacts DC, bit lines BL and first capping patterns 140*t* on the bit lines BL may be formed by patterning the first and second conductive layers 130 and 138, the polysilicon pattern 135 and the first capping layer 140 on the cell array region CA.

A filling insulation pattern 152 filling a remaining portion of the recess region 134 may be formed. A second capping pattern 148*t* may be formed on the first capping pattern 140*t*. The formation of the second capping pattern 148*t* may include forming the second capping layer 148 on an entire surface of the substrate 10, and patterning the second capping layer 148 on the cell array region CA. Bit line spacers 154 may be formed to cover both side surfaces of the bit line BL and both side surfaces of the bit line capping pattern 150. The formation of the bit line spacers 154 may include conformally depositing a bit line spacer layer on the cell array region CA, and performing an anisotropic etching process on the bit line spacer layer. A storage node contact BC may be formed between a pair of the bit lines BL adjacent to each other in the first direction D1. A landing pad LP may be formed on the storage node contact BC. A landing pad separation pattern 164 defining the landing pad LP may be formed. A data storage element 170 may be formed on the landing pad LP.

First to fourth peripheral gate patterns GP1, GP2, GP3 and GP4 may be formed by patterning the high-voltage peripheral insulating layer 118, the low-voltage peripheral insulating layer 120, the high-k dielectric layer 122, the first and second conductive layers 130 and 138, the first capping layer 140 on the first to fourth peripheral regions PA1, PA2, PB1 and PB2.

First to fourth source/drain regions 144*a*, 144*b*, 144*c* and 144*d* may be formed in the first to fourth peripheral active patterns ACT1, ACT2, ACT3 and ACT4 at both sides of the first to fourth peripheral gate patterns GP1, GP2, GP3 and GP4. Peripheral spacers 142 may be formed to cover side surfaces of the first to fourth peripheral gate patterns GP1, GP2, GP3 and GP4. The formation of the peripheral spacers 142 may include conformally depositing a peripheral spacer layer on the first to fourth peripheral regions PA1, PA2, PB1 and PB2, and performing an anisotropic etching process on the peripheral spacer layer. A peripheral interlayer insulating layer 146 may be formed to cover the peripheral spacers 142 and the first to fourth peripheral gate patterns GP1, GP2, GP3 and GP4. The second capping layer 148 may be formed on the peripheral interlayer insulating layer 146. For example, the peripheral interlayer insulating layer 146 may be formed of silicon oxide, and the second capping layer 148 may be formed of silicon nitride.

Figure 12:
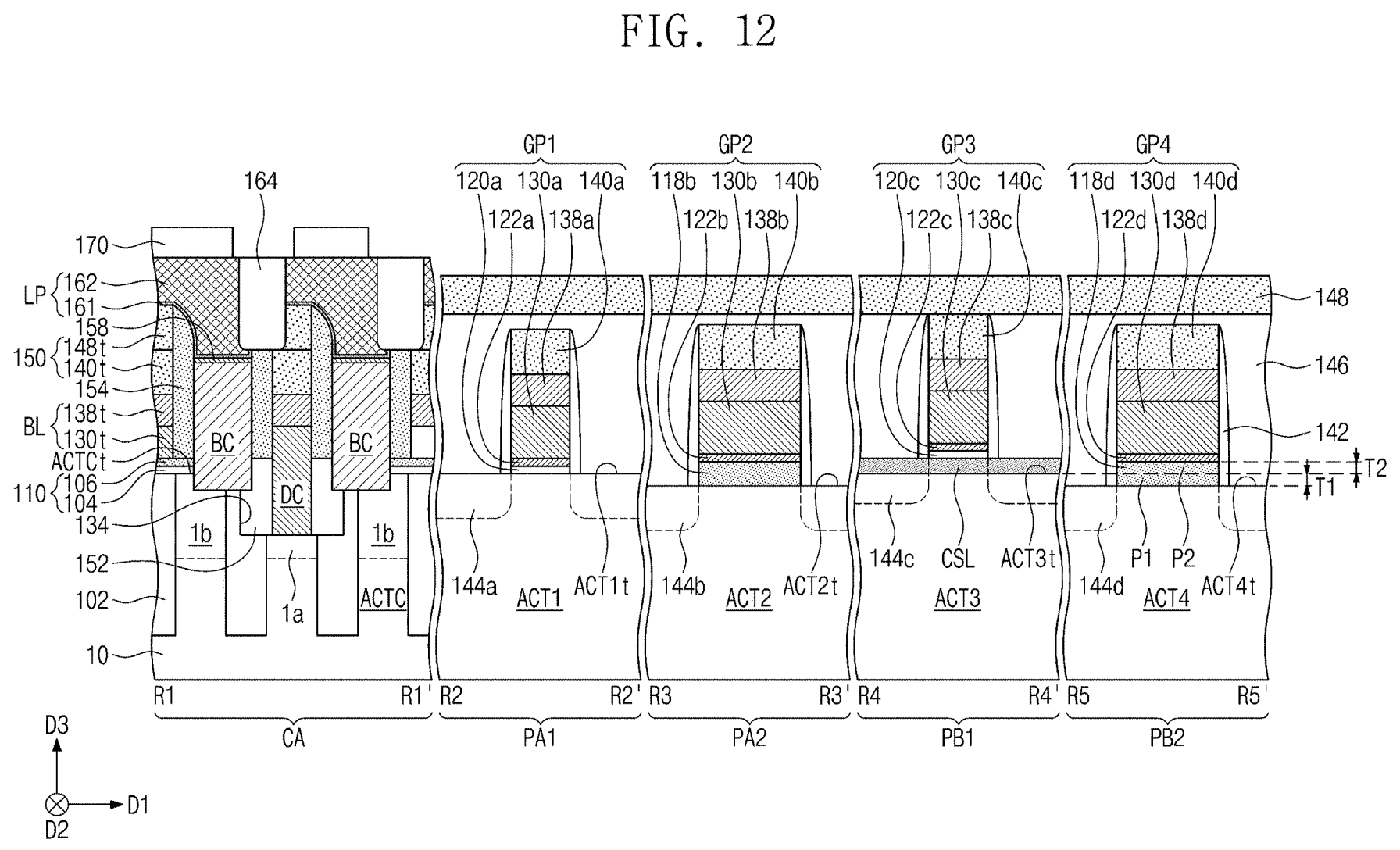

FIG. 12 is a cross-sectional view taken along the lines R1-R1', R2-R2', R3-R3', R4-R4' and R5-R5' of FIG. 1, which illustrates a semiconductor device according to some embodiments of the inventive concepts. Hereinafter, for the purpose of ease and convenience in explanation, the descriptions to substantially the same features as in the embodiments of FIGS. 1 and 2 will be omitted and differences between the present embodiments and the embodiments of FIGS. 1 and 2 will be mainly described in detail.

Referring to FIGS. 1 and 12, the top surfaces ACT2t and ACT4t of the second and fourth peripheral active patterns ACT2 and ACT4 of the second and fourth peripheral regions PA2 and PB2 may be located at a lower level than the top surfaces ACTCt of the cell active patterns ACTC of the cell array region CA and the top surfaces ACT1t and ACT3t of the first and third peripheral active patterns ACT1 and ACT3 of the first and third peripheral regions PA1 and PB1. In other words, the top surface of the substrate 10 may have step differences at a boundary between the first peripheral region PA1 and the second peripheral region PA2, the boundary between the second peripheral region PA2 and the third peripheral region PB1, and the boundary between the third peripheral region PB1 and the fourth peripheral region PB2. The top surface ACT1t of the first peripheral active pattern ACT1 may be located at substantially the same level as the top surfaces ACTCt of the cell active patterns ACTC and the top surface ACT3t of the third peripheral active pattern ACT3. The top surface ACT2t of the second peripheral active pattern ACT2 may be located at substantially the same level as the top surface ACT4t of the fourth peripheral active pattern ACT4.

Figure 13:
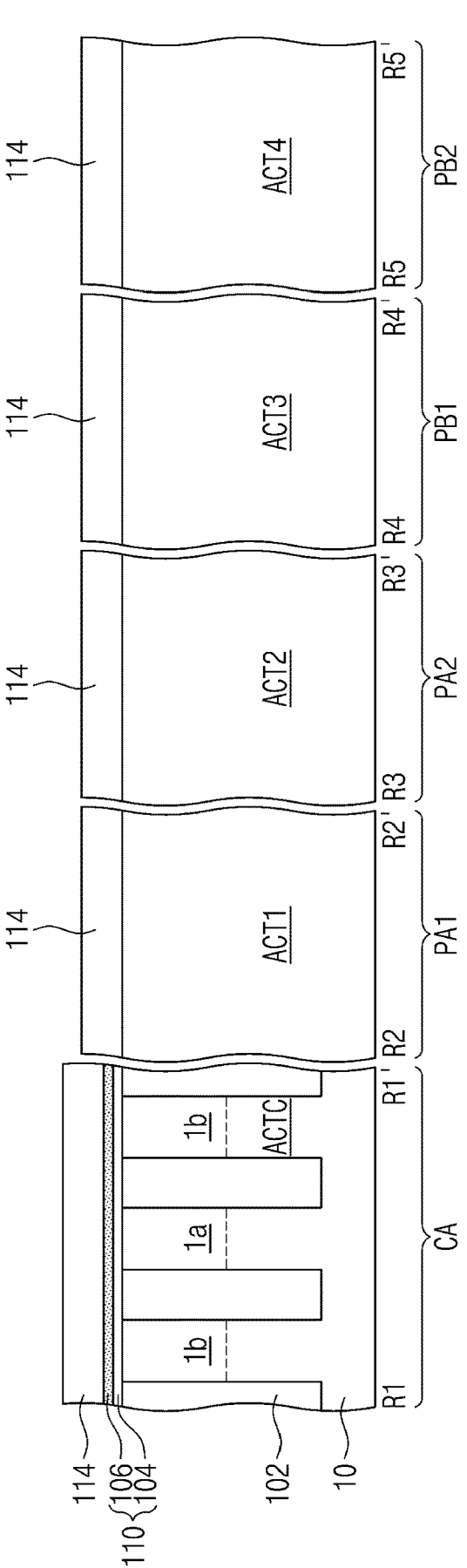
FIGS. 13 to 15 are cross-sectional views taken along the lines R1-R1', R2-R2', R3-R3', R4-R4' and R5-R5' of FIG. 1, which illustrate a method of manufacturing a semiconductor device according to some embodiments of the inventive concepts.
Figure 14:
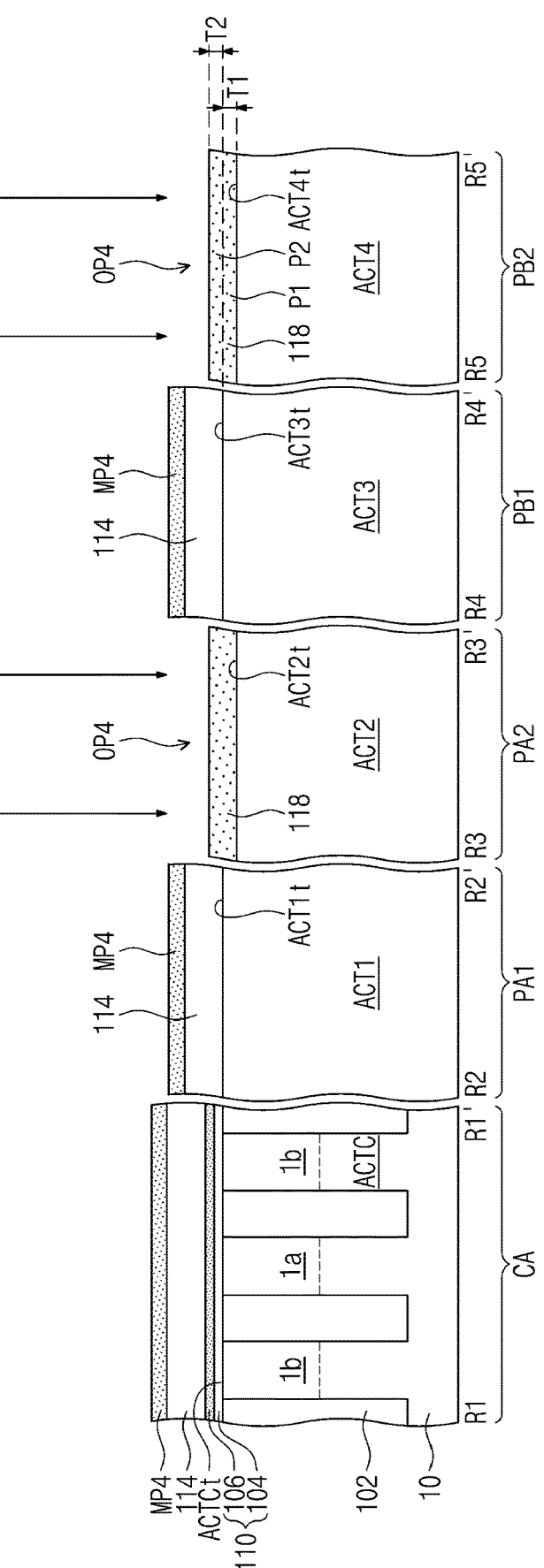
Figure 15:
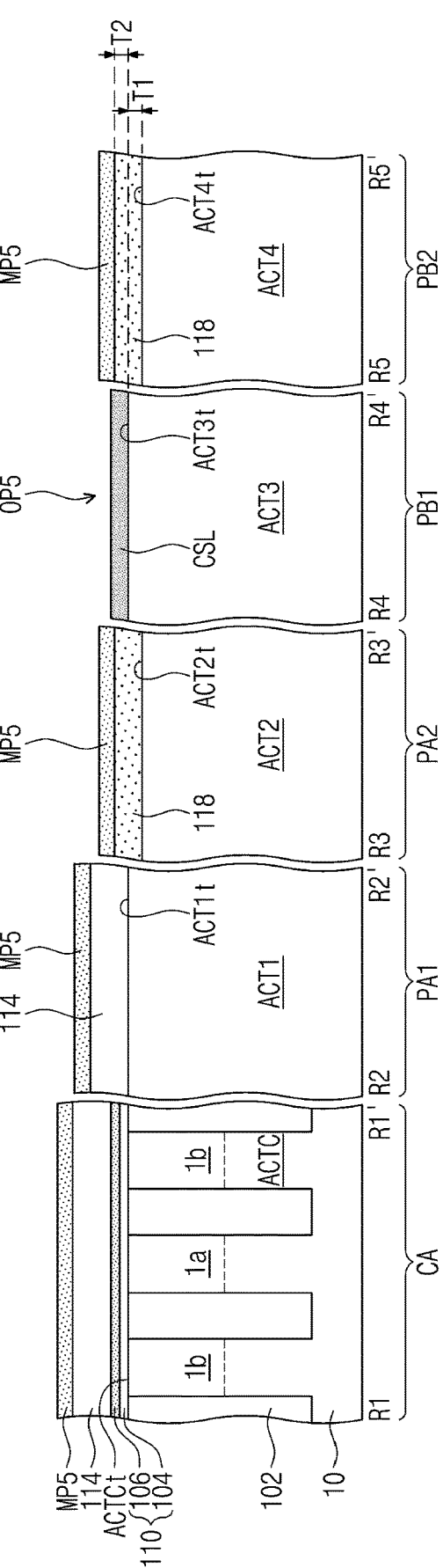

FIGS. 13 to 15 are cross-sectional views taken along the lines R1-R1', R2-R2', R3-R3', R4-R4' and R5-R5' of FIG. 1, which illustrate a method of manufacturing a semiconductor device according to some embodiments of the inventive concepts. Hereinafter, a method of manufacturing the semiconductor device described with reference to FIGS. 1 and 12 will be described in detail with reference to FIGS. 13 to 15.

Referring to FIG. 13, the buffer layer 110 including the first buffer insulating layer 104 and the second buffer insulating layer 106 may be formed on the cell array region CA. Thereafter, the first sacrificial insulating layer 114 may be formed on an entire surface of the substrate 10.

Referring to FIGS. 13 and 14, a fourth mask pattern MP4 may be formed to cover the cell array region CA and the first and third peripheral regions PA1 and PB1. The fourth mask pattern MP4 may have a fourth opening OP4 exposing the second and fourth peripheral regions PA2 and PB2. The first sacrificial insulating layer 114 on the second and fourth peripheral regions PA2 and PB2 exposed by the fourth opening OP4 may be removed. A thermal oxidation process may be performed on the second and fourth peripheral active patterns ACT2 and ACT4 exposed by the removal of the first sacrificial insulating layer 114. A high-voltage peripheral insulating layer 118 may be formed on the second and fourth peripheral active patterns ACT2 and ACT4 by the thermal oxidation process. The high-voltage peripheral insulating layer 118 may include a first portion P1 corresponding to an oxidized portion of each of the second and fourth peripheral active patterns ACT2 and ACT4, and a second portion P2 formed on the first portion P1. Thereafter, the fourth mask pattern MP4 may be removed.

Referring to FIGS. 14 and 15, a fifth mask pattern MP5 may be formed to cover the cell array region CA and the first, second and fourth peripheral regions PA1, PA2 and PB2. The fifth mask pattern MP5 may have a fifth opening OP5 exposing the third peripheral region PB1. The first sacrificial insulating layer 114 on the third peripheral region PB1 exposed by the fifth opening OP5 may be removed. The channel semiconductor layer CSL may be formed on the third peripheral active pattern ACT3 exposed by the removal of the first sacrificial insulating layer 114. Thereafter, the fifth mask pattern MP5 and the first sacrificial insulating layer 114 on the cell array region CA and the first peripheral region PA1 may be removed, and the low-voltage peripheral insulating layer 120 may be formed on the first and third peripheral regions PA1 and PB1. A subsequent manufacturing method may be substantially the same as described with reference to FIGS. 1 and 2.

Figure 16:
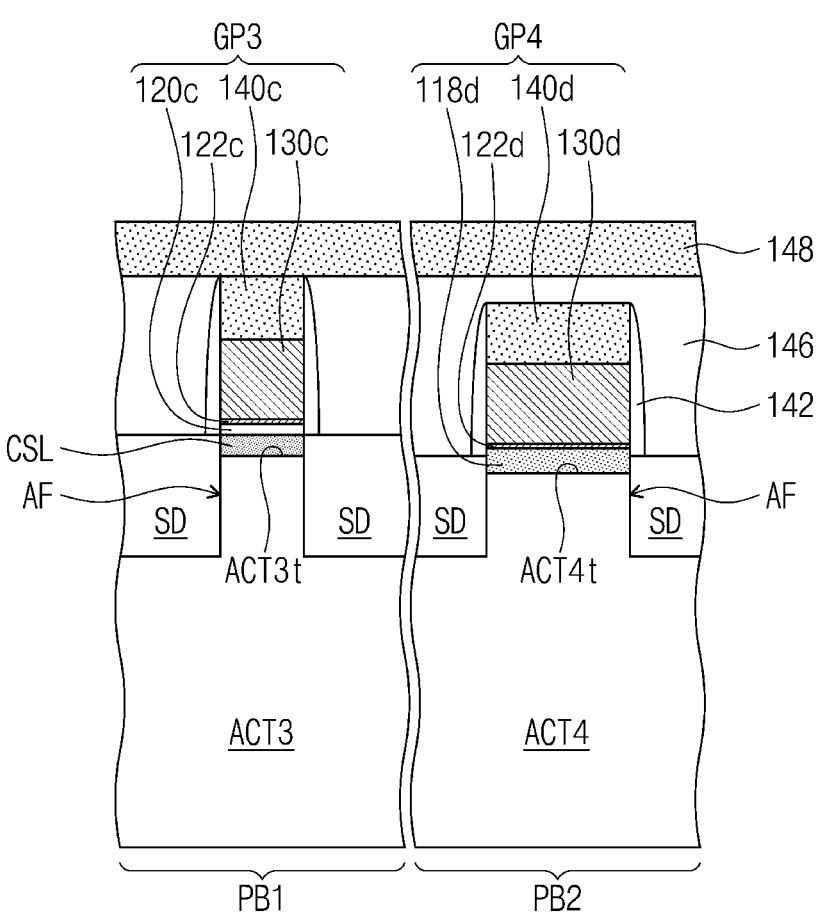
FIGS. 16 and 17 are cross-sectional views taken along the lines R4-R4' and R5-R5' of FIG. 1, which illustrate semiconductor devices according to some embodiments of the inventive concepts.

FIG. 16 is a cross-sectional view taken along the lines R4-R4' and R5-R5' of FIG. 1, which illustrates a semiconductor device according to some embodiments of the inventive concepts. Hereinafter, for the purpose of ease and convenience in explanation, the descriptions to substantially the same features as in the embodiments of FIGS. 1 and 2 will be omitted and differences between the present embodiments and the embodiments of FIGS. 1 and 2 will be mainly described in detail.

Referring to FIG. 16, each of third and fourth peripheral active patterns ACT3 and ACT4 may include an active fin AF corresponding to its upper portion. Hereinafter, the third and fourth peripheral active patterns ACT3 and ACT4 will be described as an example, the descriptions to the third peripheral active pattern ACT3 may be substantially equally applied to the first peripheral active pattern ACT1, and the descriptions to the fourth peripheral active pattern ACT4 may be substantially equally applied to the second peripheral active pattern ACT2. The active fin AF may be a vertically protruding portion of each of the third and fourth peripheral active patterns ACT3 and ACT4. A pair of source/drain patterns SD may be provided at both sides of the active fin AF, respectively. Each of the source/drain patterns SD may be formed by a selective epitaxial growth (SEG) process using a side surface of the active fin AF as a seed.

A channel semiconductor layer CSL and a third peripheral insulating pattern 120c may be sequentially provided on the active fin AF of the third peripheral active pattern ACT3 of the third peripheral region PB1. A fourth peripheral insulating pattern 118d may be provided on the active fin AF of the fourth peripheral active pattern ACT4 of the fourth peripheral region PB2. A topmost surface ACT4t of the fourth peripheral active pattern ACT4 (i.e., a top surface of the active fin AF of the fourth peripheral active pattern ACT4) may be located at a lower level than a topmost surface ACT3t of the third peripheral active pattern ACT3 (i.e., a top surface of the active fin AF of the third peripheral active pattern ACT3).

Figure 17:
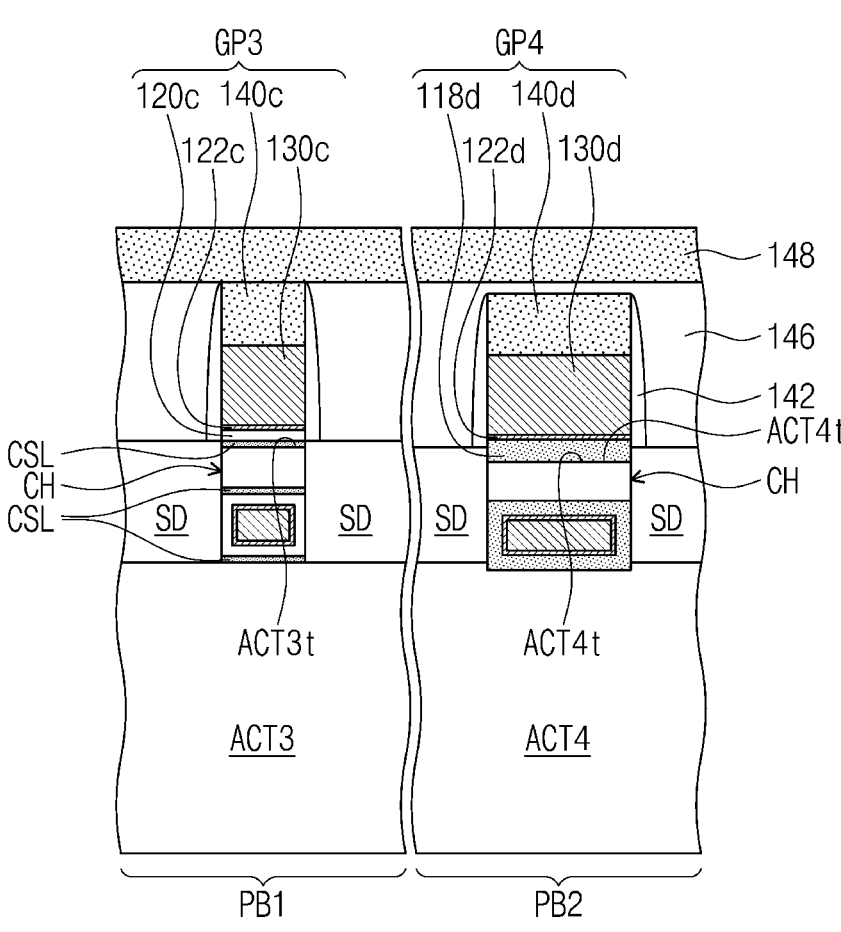

FIG. 17 is a cross-sectional view taken along the lines R4-R4' and R5-R5' of FIG. 1, which illustrate a semiconductor device according to some embodiments of the inventive concepts. Hereinafter, for the purpose of ease and convenience in explanation, the descriptions to substantially the same features as in the embodiments of FIGS. 1, 2 and 16 will be omitted and differences between the present embodiments and the embodiments of FIGS. 1, 2 and 16 will be mainly described in detail.

Referring to FIG. 17, each of third and fourth peripheral active patterns ACT3 and ACT4 may include a channel layer CH corresponding to its upper portion. The channel layer CH may be vertically spaced apart from a lower portion of each of the third and fourth peripheral active patterns ACT3 and ACT4.

A portion of a third peripheral conductive pattern 130*c* may be provided between the lower portion and the upper portion (i.e., the channel layer CH) of the third peripheral active pattern ACT3. A third peripheral high-k dielectric pattern 122*c* and a third peripheral insulating pattern 120*c* may surround the portion of the third peripheral conductive pattern 130*c*. A channel semiconductor layer CSL may be provided to cover a top surface of the lower portion of the third peripheral active pattern ACT3 and a top surface and a bottom surface of the channel layer CH of the third peripheral active pattern ACT3.

A portion of a fourth peripheral conductive pattern 130*d* may be provided between the lower portion and the upper portion (i.e., the channel layer CH) of the fourth peripheral active pattern ACT4. A fourth peripheral high-k dielectric pattern 122*d* and a fourth peripheral insulating pattern 118*d* may surround the portion of the fourth peripheral conductive pattern 130*d*. In some embodiments, a thickness of the fourth peripheral insulating pattern 118*d* may be greater than a thickness of the third peripheral insulating pattern 120*c*. A topmost surface ACT4*t* of the fourth peripheral active pattern ACT4 (i.e., a top surface of the channel layer CH of the fourth peripheral active pattern ACT4) may also be located at a lower level than a topmost surface ACT3*t* of the third peripheral active pattern ACT3 (i.e., the top surface of the channel layer CH of the third peripheral active pattern ACT3).

According to the inventive concepts, the peripheral circuit transistors having different characteristics may be formed by selectively performing the thermal oxidation process to minimize or prevent a thermal effect applied to the channel semiconductor layer including silicon-germanium, and thus electrical characteristics and reliability of the semiconductor device may be improved.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device comprising:
a substrate having first and second active patterns therein, which are spaced apart from each other, said first active pattern having a top surface that is elevated relative to a top surface of the second active pattern;
a channel semiconductor layer on the top surface of the first active pattern, wherein a lattice constant of the channel semiconductor layer is greater than a lattice constant of the substrate;
a first gate pattern including a first insulating pattern, on the channel semiconductor layer; and
a second gate pattern including a second insulating pattern having a thickness greater than a thickness of the first insulating pattern, on the top surface of the second active pattern.

2. The device of claim 1, wherein a first portion of the second insulating pattern extends at a lower level relative to the top surface of the first active pattern, and a second portion of the second insulating pattern extends at a higher level than the top surface of the first active pattern, as measured in a direction normal to the top surface of the second active pattern.

3. The device of claim 2, wherein a thickness of the first portion is in a range from about 0.5 times to about 2 times a thickness of the second portion.

4. The device of claim 1, wherein a thickness of the second insulating pattern is in a range from about 2 times to about 10 times a thickness of the first insulating pattern.

5. The device of claim 1,
wherein the first gate pattern further comprises a first high-k dielectric pattern on the first insulating pattern;
wherein the second gate pattern further comprises a second high-k dielectric pattern on the second insulating pattern; and
wherein each of the first and second high-k dielectric patterns includes a material having a dielectric constant greater than a dielectric constant of silicon oxide.

6. The device of claim 1, wherein a width of the first gate pattern is less than a width of the second gate pattern.

7. The device of claim 1, further comprising:
spacers covering side surfaces of the first and second gate patterns;
an interlayer insulating layer covering the second gate pattern and the spacers; and
a capping layer on the interlayer insulating layer.

8. The device of claim 7, wherein a top surface of the interlayer insulating layer is substantially coplanar with a top surface of the first gate pattern.

9. The device of claim 1, wherein each of the first and second active patterns includes an active semiconductor fin vertically protruding upward from a lower portion of each of the first and second active patterns.

10. The device of claim 1,
wherein the first gate pattern further includes a first conductive pattern on the first insulating pattern;
wherein the first active pattern includes a channel layer therein, which extends between a buried portion of the first conductive pattern and a portion of the first conductive pattern on the top surface of the first active pattern, which is spaced apart from the buried portion of the first conductive pattern.

11. The device of claim 10, wherein the channel semiconductor layer covers a top surface and a bottom surface of the channel layer within the first active pattern.

12. A semiconductor device, comprising:
a substrate having first, second, third, and fourth active patterns therein, which are spaced apart from each other;
first to fourth gate patterns extending on the first, second, third, and fourth active patterns, respectively; and
a channel semiconductor layer extending between the third active pattern and the third gate pattern, wherein a lattice constant of the channel semiconductor layer is greater than a lattice constant of the substrate;
wherein the first gate pattern comprises a first insulating pattern, a first high-k dielectric pattern and a first conductive pattern, which are sequentially stacked on the first active pattern;
wherein the second gate pattern comprises a second insulating pattern, a second high-k dielectric pattern and a second conductive pattern, which are sequentially stacked on the second active pattern;
wherein the third gate pattern comprises a third insulating pattern, a third high-k dielectric pattern and a third conductive pattern, which are sequentially stacked on the channel semiconductor layer;

wherein the fourth gate pattern comprises a fourth insulating pattern, a fourth high-k dielectric pattern and a fourth conductive pattern, which are sequentially stacked on the fourth active pattern;

wherein a thickness of each of the second and fourth insulating patterns is greater than a thickness of each of the first and third insulating patterns; and wherein a top surface of the third active pattern is located at a higher level than a top surface of each of the second and fourth active patterns.

13. The device of claim 12, wherein the top surface of the third active pattern is located at a higher level than a top surface of the first active pattern.

14. The device of claim 12, wherein the top surface of the third active pattern is located at substantially the same level as a top surface of the first active pattern.

15. The device of claim 12, wherein each of the second and fourth insulating patterns includes: (i) a first portion located at a lower level than the top surface of the third active pattern, and (ii) a second portion located at a higher level than the top surface of the third active pattern; and wherein a ratio of a first thickness of the first portion to a total thickness of each of the second and fourth insulating patterns ranges from about 30% to about 70%.

16. The device of claim 12, wherein the channel semiconductor layer includes silicon-germanium (SiGe).

17. The device of claim 12, wherein the first to fourth conductive patterns include doped polysilicon; and wherein a conductivity type of the first and second conductive patterns is different from a conductivity type of the third and fourth conductive patterns.

18. A semiconductor device, comprising:

a substrate including: (i) cell active patterns on a cell array region, and (i) a first peripheral active pattern and a second peripheral active pattern that are spaced apart from each other on a peripheral region, in a vicinity of the cell array region;

word lines extending on the substrate, and intersecting the cell active patterns;

bit lines extending on the substrate, and intersecting the word lines;

a bit line contact extending on a central portion of each of the cell active patterns, and connected to each of the bit lines;

a storage node contact on each of both end portions of each of the cell active patterns;

a landing pad on the storage node contact;

a data storage element on the landing pad;

a first peripheral gate pattern on the first peripheral active pattern;

a channel semiconductor layer between the first peripheral active pattern and the first peripheral gate pattern, wherein a lattice constant of the channel semiconductor layer is greater than a lattice constant of the substrate; and a second peripheral gate pattern on the second peripheral active pattern;

wherein the first peripheral gate pattern includes a first peripheral insulating pattern on the channel semiconductor layer;

wherein the second peripheral gate pattern includes a second peripheral insulating pattern on the second peripheral active pattern;

wherein a thickness of the second peripheral insulating pattern is greater than a thickness of the first peripheral insulating pattern; and wherein a top surface of the first peripheral active pattern and top surfaces of the cell active patterns are located at a higher level than a top surface of the second peripheral active pattern.

19. The semiconductor device of claim 18, wherein the data storage element comprises a capacitor including a lower electrode, a dielectric layer, and an upper electrode.

20. The semiconductor device of claim 18, wherein a first portion of the second peripheral insulating pattern extends at a lower level relative to the top surface of the first peripheral active pattern, and a second portion of the second peripheral insulating pattern extends at a higher level than the top surface of the first peripheral active pattern, as measured in a direction normal to the top surface of the second peripheral active pattern.

* * * * *